(12) United States Patent
Sekizaki et al.

(10) Patent No.: US 9,335,381 B2
(45) Date of Patent: May 10, 2016

(54) VOLTAGE MONITORING APPARATUS FOR PLURAL BATTERY

(71) Applicant: YAZAKI CORPORATION, Tokyo (JP)

(72) Inventors: Masashi Sekizaki, Makinohara (JP); Satoshi Ishikawa, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 463 days.

(21) Appl. No.: 13/859,953

(22) Filed: Apr. 10, 2013

(65) Prior Publication Data

US 2013/0234719 A1    Sep. 12, 2013

Related U.S. Application Data

(63) Continuation of application No. PCT/JP2011/073383, filed on Oct. 12, 2011.

(30) Foreign Application Priority Data

Oct. 14, 2010   (JP) .................................. 2010-231205

(51) Int. Cl.
*G01R 31/36* (2006.01)
*G01R 35/00* (2006.01)
*G01R 19/165* (2006.01)

(52) U.S. Cl.
CPC .......... *G01R 31/362* (2013.01); *G01R 31/3658* (2013.01); *G01R 35/00* (2013.01); *G01R 19/16542* (2013.01)

(58) Field of Classification Search
CPC ................ H02J 7/0026; H02J 7/0021; G01R 19/16542; G01R 31/3658

USPC ......................................................... 324/433
See application file for complete search history.

(56) References Cited

U.S. PATENT DOCUMENTS 6,060,864 A * 5/2000 Ito et al. ......................... 320/136
2003/0015995 A1* 1/2003 Tamura et al. ................. 320/162
(Continued)

FOREIGN PATENT DOCUMENTS

| CN | 1101773 A | 4/1995 |
| CN | 101176885 A | 5/2008 |

(Continued)

OTHER PUBLICATIONS

The Japanese official action letter issued on Nov. 4, 2014 in the counterpart Japanese patent application.
(Continued)

*Primary Examiner* — Richard Isla Rodas
*Assistant Examiner* — Dung V Bui
(74) *Attorney, Agent, or Firm* — Mots Law, PLLC

(57) ABSTRACT

A fail signal indicating overcharge/overdischarge of unit cells detected by voltage detecting ICs (21-1) to (**21-*n*) is transmitted as a digital signal and an analog signal to a CPU 32. If the analog fail signal and digital fail signal agree with each other, the CPU 32** determines that overcharge or overdischarge is occurring in the unit cells. If the fail signals disagree with each other, it is determined that an error is occurring in data communication in communication lines L1 to L3 and the error is informed to an operator with an alarm signal or the like. As a result, overcharge or overdischarge is highly accurately detectable.

12 Claims, 3 Drawing Sheets

(56) References Cited

U.S. PATENT DOCUMENTS

| | | | |
|---|---|---|---|
| 2006/0028179 A1* | 2/2006 | Yudahira et al. | 320/133 |
| 2009/0087722 A1* | 4/2009 | Sakabe et al. | 429/61 |
| 2009/0179650 A1* | 7/2009 | Omagari | 324/433 |

FOREIGN PATENT DOCUMENTS

| | | |
|---|---|---|
| CN | 101420133 A | 4/2009 |
| JP | S63-141101 A | 6/1988 |
| JP | 2002-365038 A | 12/2002 |
| JP | 2003-32907 A | 1/2003 |
| JP | 2003-092840 A | 3/2003 |
| JP | 2005-318751 A | 11/2005 |
| JP | 2006-062482 A | 3/2006 |
| JP | 2006-64639 A | 3/2006 |
| JP | 2009-89487 A | 4/2009 |
| JP | 2010-35337 A | 2/2010 |
| JP | 2010-118063 A | 5/2010 |
| JP | 2010-130827 A | 6/2010 |

OTHER PUBLICATIONS

The Chinese official action letter issued on Dec. 29, 2014 in the counterpart Chinese patent application.

The Japanese official action issued on Jun. 17, 2014 in the counterpart Japan patent application. (Partial English translation also submitted.).

The Chinese official action issued on Jul. 11, 2014 in the counterpart Chinese patent application.

* cited by examiner

| DETERMINATION RESULT | TIME T1 | TIME T2 |
|---|---|---|
| NO ABNORMALITY | Hi | Hi |
| OVERCHARGE | Lo | Hi |
| OVERDISCHARGE | Hi | Lo |
| OVERCHARGE & OVERDISCHARGE | Lo | Lo |

VOLTAGE MONITORING APPARATUS FOR PLURAL BATTERY

CROSS REFERENCE TO RELATED APPLICATION

This application is a Continuation of PCT Application No. PCT/JP2011/073383, filed on Oct. 12, 2011, and claims the benefit of priority under 35 U.S.C. 119(a) to Japanese Patent Application No. 2010-231205 filed on Oct. 14, 2010 whose disclosed contents are cited herein.

BACKGROUND

1. Technical Field

The present invention relates to a voltage monitoring apparatus to determine whether or not each cell voltage is normal in a plural battery that connects a plurality of unit cells in series to output a required voltage.

2. Background Art

For example, an electric car or a hybrid vehicle has a high-voltage battery as a power source for driving a motor. Such a high-voltage battery connects a plurality of unit cells of a secondary battery (rechargeable battery) such as a nickel-hydrogen battery and a lithium battery in series to provide a high voltage.

Each unit cell of the secondary battery is charged with the same power and is discharged at the same power. Accordingly, if the unit cells differently deteriorate, the secondary battery will easily get an overcharge or overdischarge state. To prevent the overcharge or overdischarge state of the secondary battery, the charging state of each unit cell must be checked.

Previously, a plurality of unit cells (for example, fifty five unit cells) are divided into, for example, five blocks (namely, eleven unit cells per block) and the voltage of each block is measured in real time with a voltage detecting IC provided for each block, to monitor if the voltage is abnormal.

At this time, the voltage detecting IC measures the voltage of each of the unit cells (for example, 11 cells) contained in the block and converts a measured analog voltage signal into a digital signal with an A/D converter provided for the voltage detecting IC. The digitized measured voltage is compared with upper and lower thresholds of cell voltage, and if the measured voltage is equal to or greater than the upper threshold, it is determined to be overcharge. If the measured voltage is equal to or lower than the lower threshold, it is determined to be overdischarge. A related art is disclosed in, for example, Japanese Unexamined Patent Application Publication No. 2010-35337. Thereafter, the determination result is transmitted as a digital fail signal to a microcomputer on a low-voltage side, so that the microcomputer may recognize the cell voltage abnormality.

SUMMARY OF INVENTION

Problem to be Solved by Invention

The voltage monitoring apparatus according to the related art, however, transmits the digital fail signal from the voltage detecting IC to the microcomputer, to inform of an occurrence of overcharge or overdischarge. Accordingly, if a communication line of the digital signal causes a communication error, a problem arises that the occurrence of overcharge or overdischarge is not correctly informed to the microcomputer side.

The present invention has been made to solve such a problem and provides a voltage monitoring apparatus for a plural battery, capable of surely transmitting overcharge or overdischarge data detected by a voltage abnormality detecting unit to a monitoring apparatus side.

Means to Solve Problem

According to a technical aspect of the present invention, there is provided a voltage monitoring apparatus for a plural battery that connects a plurality of cells in series to output a required voltage. The apparatus monitors an abnormality in an output voltage of each of the cells and includes a voltage abnormality detecting unit provided for each of a plurality of blocks into which the plurality of cells are divided. The voltage abnormality detecting unit detects a voltage abnormality in each of the cells contained in the block and includes a voltage detector that detects a cell voltage of each of the cells contained in the block, a comparator that compares the cell voltage detected by the voltage detector with preset upper and lower thresholds and determines whether or not the cell voltage is overcharge or overdischarge, and a transmitter that transmits the determination result of the comparator as a digital determination signal and an analog determination signal. The apparatus also includes a monitoring unit that determines, according to the digital determination signal and analog determination signal, whether or not the individual voltage abnormality detecting units are normally operating.

MODE OF IMPLEMENTING INVENTION

Figure 1:
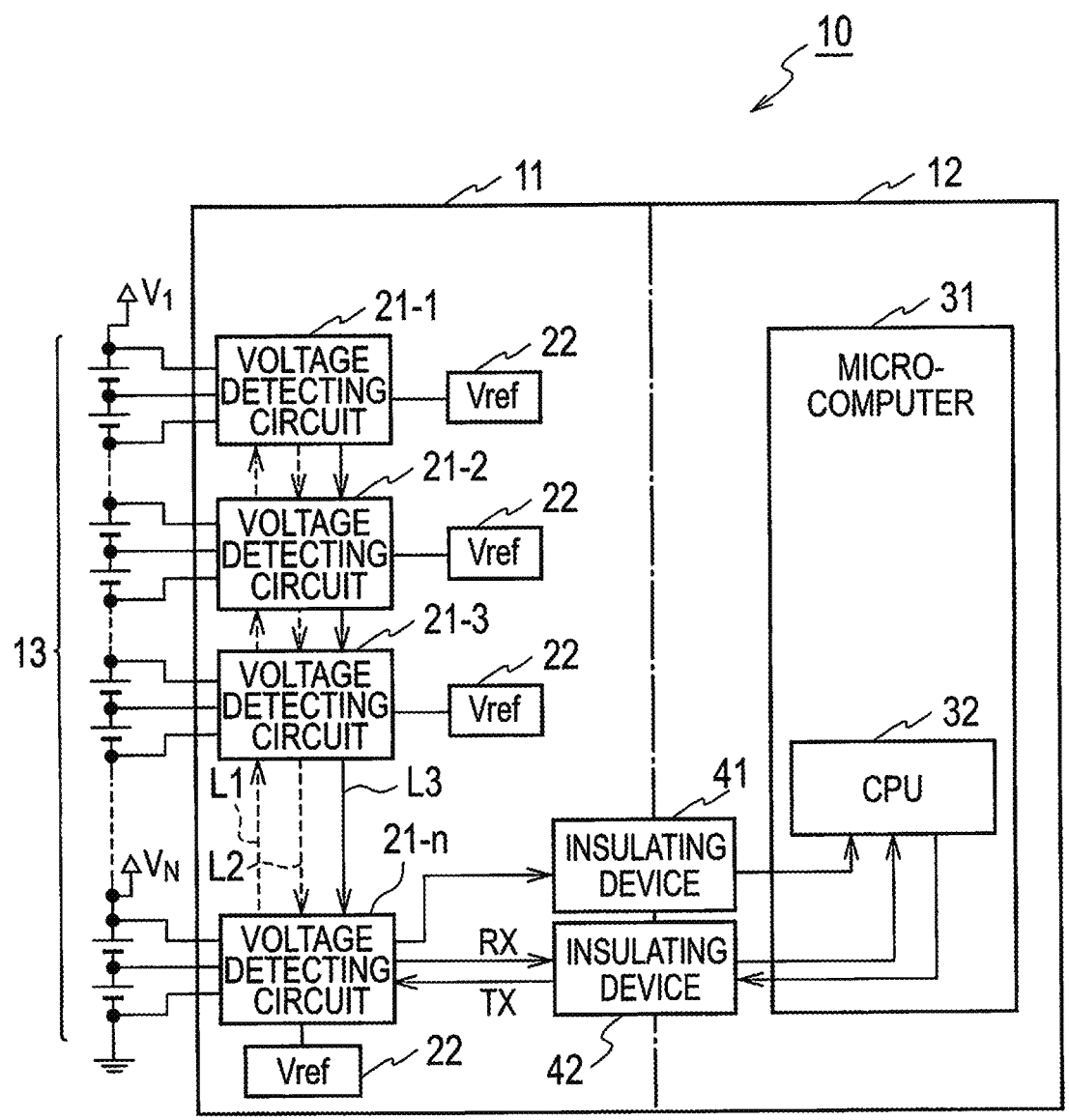
FIG. 1 is a block diagram illustrating a configuration of a voltage monitoring apparatus for a plural battery according to an embodiment of the present invention.
Figure 2:
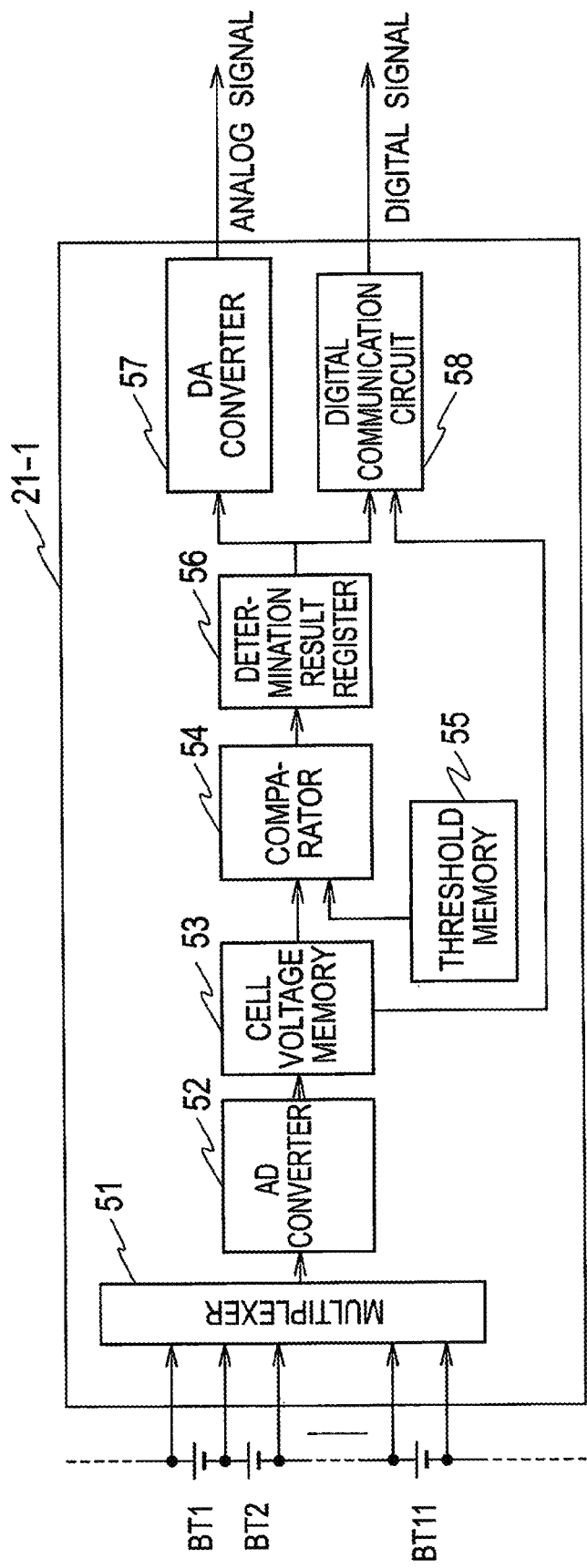
FIG. 2 is a block diagram illustrating a detailed configuration of a voltage detecting IC arranged in the voltage monitoring apparatus for a plural battery according to the embodiment of the present invention.

An embodiment of the present invention will be explained with reference to the drawings. FIG. 1 is a block diagram illustrating a voltage monitoring apparatus 10 according to the embodiment of the present invention and a secondary battery (plural battery) 13 including a plurality of unit cells BT1 to BT55. FIG. 2 is a block diagram illustrating a detailed configuration of a first voltage detecting IC (21-1). The secondary battery 13 adopted by this embodiment is used as, for example, a high-voltage battery to drive a motor of an electric car, a hybrid vehicle, or the like.

As illustrated in FIG. 1, the voltage monitoring apparatus 10 according to the embodiment is separated by insulating devices 41 and 42 into a high-voltage side 11 and a low-voltage side 12.

The high-voltage side 11 includes n voltage detecting ICs, i.e., a first voltage detecting IC (21-1) to an n-th voltage detecting IC (21-n). Each of the voltage detecting ICs (21-1)

to (21-n) is a voltage abnormality detecting unit that is connected to a plurality of unit cells to measure a voltage of each of the unit cells.

The low-voltage side 12 includes a microcomputer 31 such as a microcontroller having a CPU (monitoring unit) 32. The CPU 32 receives unit-cell voltages detected by the voltage detecting ICs (21-1) to (21-n) of the high-voltage side 11, displays the unit-cell voltages on a display unit (not illustrated) and the like, and informs of an overcharge or overdischarge state of the unit-cell voltages according to overcharge and overdischarge data (fail signal) transmitted from the voltage detecting ICs (21-1) to (21-n).

Each of the voltage detecting ICs (21-1) to (21-n) has an AD converter (A/D converting unit) 26 (refer to FIG. 2) to convert cell voltages (an analog voltage signal) of the voltage detecting IC into a digital voltage signal with the use of an A/D conversion voltage Vref provided by a reference power source 22.

Adjacent ones of the voltage detecting ICs (21-1) to (21-n) are connected to each other through digital communication lines L1 and L2. In addition, the voltage detecting ICs are connected through the insulating device 42 to the microcomputer 31. Accordingly, a TX signal, such as a voltage detection instructing signal, outputted from the microcomputer 31 is transmitted through daisy-chain communication to the voltage detecting ICs (21-1) to (21-n) and an RX signal, such as a fail signal indicative of overcharge or overdischarge, outputted from the voltage detecting ICs (21-1) to (21-n) is transmitted through the daisy-chain communication to the microcomputer 31.

Adjacent ones of the voltage detecting ICs (21-1) to (21-n) are connected to each other through a communication line L3 and are also connected through the insulating device 41 to the CPU 32 of the microcomputer 31.

With reference to FIG. 2, the detailed configuration of each of the voltage detecting ICs (21-1) to (21-n) will be explained. Here, the first voltage detecting IC (21-1) will be explained as an example.

As illustrated in FIG. 2, the first voltage detecting IC (21-1) includes a multiplexer 51 that is connected to a plurality of unit cells BT1 to BT11 (the number of cells is assumed to be eleven as an example), detects output power of the unit cells, and converts detected voltage signals of the unit cells BT1 to BT11 into a single time-series signal, an AD converter 52 that digitizes the voltage signal (analog signal) outputted from the multiplexer 51, and a cell voltage memory 53 that stores the digitized voltage signal from the AD converter 52.

Also included are a threshold memory 55 that stores an upper threshold to determine overcharge of cell voltage and a lower threshold to determine overdischarge of cell voltage, a comparator 54 that compares the cell voltages of the unit cells BT1 to BT11 with the upper and lower thresholds stored in the threshold memory 55, a determination result register 56 that stores a determination result from the comparator 54, a DA converter 57, and a digital communication circuit 58.

The determination result register 56 determines that, if the cell voltage of a given unit cell is equal to or greater than the upper threshold, the unit cell is in an overcharge state and that, if the cell voltage is equal to or lower than the lower threshold, the unit cell is in an overdischarge state and stores the determination result.

The DA converter 57 converts the determination result data (digital signal) stored in the determination result register 56 into an analog signal and transmits the analog signal through the analog communication line L3 and insulating device 41 illustrated in FIG. 1 to the CPU 32 of the microcomputer 31. At this time, the DA converter 57 divides a communication period of X (ms) into time T1 and T2 as illustrated in FIG. 3(b), and according to a combination of output levels "Hi" and "Lo" in the time T1 and T2, generates a signal (fail signal) indicating overcharge or overdischarge.

Figures 3, 4:
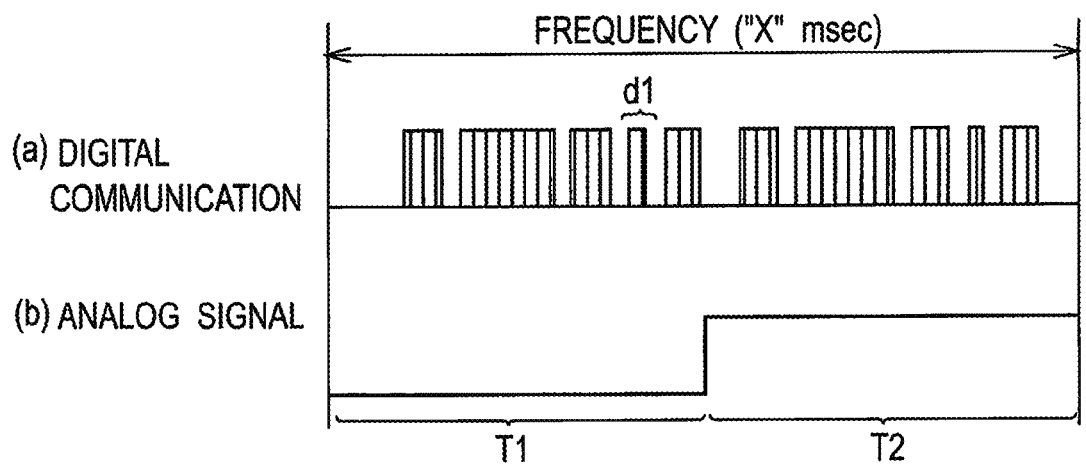
FIG. 3 is a waveform diagram illustrating a digital signal and an analog signal transmitted from the voltage detecting IC of the voltage monitoring apparatus for a plural battery according to the embodiment of the present invention.
FIG. 4 is an explanatory view illustrating the details of the analog signal transmitted from the voltage detecting IC of the voltage monitoring apparatus for a plural battery according to the embodiment of the present invention.

As illustrated in FIG. 4, this embodiment indicates no abnormality if the time T1 and T2 are both Hi, an occurrence of overcharge if the time T1 is Lo and the Time T2 is Hi, an occurrence of overdischarge if the time T1 is Hi and time T2 is Lo, and an occurrence of both the overcharge and overdischarge if the time T1 and T2 are both Lo. The technique of configuring the fail signal is not limited to the example illustrated in FIG. 4.

The digital communication circuit 58 employs a predetermined digital communication method to transmit the voltage data stored in the cell voltage memory 53 and the determination result data stored in the determination result register 56 at intervals of the communication period of X (ms). As a result, a digital signal that changes between logic levels of "1" and "0" as illustrated in FIG. 3(a) is transmitted through the digital communication line L2 and insulating device 42 illustrated in FIG. 1 to the CPU 32 of the microcomputer 31. For example, data "d1" in the data string illustrated in FIG. 3(a) is used as a signal (fail signal) indicating the overcharge or overdischarge of the unit cells BT1 to BT11.

Operation of the voltage monitoring apparatus according to the embodiment with the above-mentioned structure will be explained. First, the CPU 32 transmits at the predetermined intervals of X (ms) a voltage detection instructing signal through the insulating device and digital communication line L1 to the voltage detecting ICs (21-1) to (21-n).

Receiving the voltage detection instructing signal, each of the voltage detecting ICs (21-1) to (21-n) digitizes voltages of the unit cells BT1 to BT11 by the AD converter 52 and stores a digitized voltage signal in the cell voltage memory 53. Thereafter, the comparator 54 compares the voltage signal of the unit cells BT1 to BT11 stored in the cell voltage memory 53 with the upper and lower thresholds stored in the threshold memory 55 and determines whether the voltage of each of the unit cells BT1 to BT11 is overcharge i.e. whether the voltage is equal to or greater than the upper threshold, or overdischarge i.e. whether the voltage is equal to or lower than the lower threshold.

The determination result is once stored in the determination result register 56, and thereafter, is outputted to the DA converter 57 and digital communication circuit 58.

According to the overcharge or overdischarge state data of each of the unit cells BT1 to BT11 in the determination result register 56, the DA converter generates a fail signal having two levels "Hi" and "Lo" as illustrated in FIG. 3(b). For example, if all of the unit cells BT1 to BT11 have a normal voltage, the time T1 and T2 are both set to "Hi", if at least one of the unit cells BT1 to BT11 is overcharge and there is no unit cell of overdischarge, the time T1 is set to "Lo" and time T2 to "Hi", if at least one of the unit cells BT1 to BT11 is overdischarge and there is no unit cell of overcharge, the time T1 is set to "Hi" and the time T2 to "Lo", and if at least one of the unit cells BT1 to BT11 is overcharge and at least one of them overdischarge, the time T1 and T2 are both set to "Lo".

The fail signal is transmitted through the analog communication line L3 and insulating device 41 to the CPU 32.

On the other hand, the digital communication circuit 58 employs the predetermined digital communication method and transmits the voltage signal stored in the cell voltage memory 53 and the fail signal stored in the determination result register 56 through the digital communication line L2 and insulating device 41 to the CPU 32.

The CPU 32 receives the analog fail signal transmitted through the analog communication line L3 and the digital fail signal transmitted through the digital communication line L2, and according to both the fail signals, determines whether or not the unit cells connected to the voltage detecting ICs (21-1) to (21-n) are overcharge or overdischarge. This determination process determines overcharge or overdischarge when the analog fail signal and digital fail signal agree with each other. If the fail signals disagree with each other, it is determined that a communication error is occurring and inform an operator of the error with an alarm signal or the like. Accordingly, even if the communication lines L1 to L3 cause an abnormality, the embodiment can surely detect the overcharge or overdischarge of each unit cell.

In this way, the voltage monitoring apparatus 10 according to the embodiment transmits, in both digital and analog signals, a fail signal indicating overcharge or overdischarge of the unit cells detected by the voltage detecting ICs (21-1) to (21-n) to the CPU 32. If the analog fail signal and digital fail signal agree with each other, the CPU 32 determines that the unit cells are causing overcharge or overdischarge. If the fail signals disagree with each other, it is determined that an error is occurring in data communication in the communication lines L1 to L3 and the error is informed to an operator with an alarm signal or the line.

Accordingly, the embodiment surely recognizes an occurrence of overcharge or overdischarge of the unit cells and remarkably improves an overcharge/overdischarge detecting accuracy. In addition, the embodiment is capable of immediately inform an operator of a communication error occurring in the communication lines L1 to L3.

This embodiment uses, in addition to usual communication with digital signals, an analog fail signal instead of providing the digital signals with redundancy. Accordingly, the embodiment is capable of reducing a circuit scale and suppressing a cost increase.

Although the voltage monitoring apparatus for a plural battery according to the present invention has been explained with reference to the embodiment illustrated in the drawings, the present invention is not limited to the embodiment. The configuration of each part of the embodiment is replaceable with any configuration that may provide the same or similar function.

The voltage monitoring apparatus for a plural battery according to the present invention converts a fail signal indicating overcharge or overdischarge of the unit cells detected by the voltage abnormality detecting units such as the voltage detecting ICs (21-1) to (21-n) into a digital signal and an analog signal and transmits both the analog fail signal and digital fail signal to the monitoring unit such as the CPU 32. If the analog fail signal and digital fail signal agree with each other, the monitoring unit determines that the unit cells are causing overcharge or overdischarge. If both the signals disagree with each other, it is determined that a communication error is occurring in the communication line such as the communication lines L1 to L3 connecting the voltage abnormality detecting units and monitoring unit to each other.

Accordingly, the present invention is capable of surely recognizing the occurrence of overcharge or overdischarge in the unit cells and remarkably improving an overcharge/overdischarge detecting accuracy. In addition, the present invention is capable of immediately recognizing the occurrence of a communication error in the communication lines, if any.

The present invention is very useful in highly accurately detecting overcharge or overdischarge of unit cells arranged in a plural battery.

The invention claimed is:

1. A voltage monitoring apparatus for a plural battery, the plural battery outputting a required voltage and connecting a plurality of cells in series, and the apparatus monitoring an abnormality in an output voltage of each of the cells, the apparatus comprising:
   a voltage abnormality detector provided for each of a plurality of blocks into which the plurality of cells are divided, the voltage abnormality detector detecting a voltage abnormality in each of the cells contained in the block, the voltage abnormality detector including:
      a voltage detector detecting a cell voltage of each of the cells contained in the block;
      a comparator comparing the cell voltage detected by the voltage detector with preset upper and lower thresholds and determining whether or not the cell voltage is overcharge or overdischarge; and
      a transmitter transmitting the determination result of the comparator by way of a digital determination signal and an analog determination signal; and
   a monitoring unit determining whether or not the individual voltage abnormality detector is normally operating according to the digital determination signal and analog determination signal, wherein
   the monitoring unit confirms whether information about overcharge and overdischarge of the cells derived from the digital determination signal agrees or disagrees with information about overcharge and overdischarge of the cells derived from the analog determination signal, and based on the confirmation, determines whether or not a communication error is occurring in a communication line between the voltage abnormality detector and the monitoring unit.

2. The voltage monitoring apparatus for a plural battery according to claim 1, wherein
   the monitoring unit outputs an alarm signal if the information about overcharge and overdischarge of the cells derived from the digital determination signal disagrees with the information about overcharge and overdischarge of the cells derived from the analog determination signal.

3. The voltage monitoring apparatus for a plural battery according to claim 1, wherein
   the voltage abnormality detector is arranged in a high-voltage-side circuit and the monitoring unit is arranged in a low-voltage-side circuit that is connected through an insulating interface to the high-voltage-side circuit.

4. The voltage monitoring apparatus for a plural battery according to claim 1, wherein each of the voltage abnormality detectors comprises an analog to digital (AD) converter configured to convert the output voltage of each of the cells into a digital voltage signal using a conversion voltage reference provided by a reference power source.

5. The voltage monitoring apparatus for a plural battery according to claim 4, wherein each of the voltage abnormality detectors comprises a cell voltage memory configured to store the digital voltage signal.

6. The voltage monitoring apparatus for a plural battery according to claim 1, wherein each of the voltage abnormality detectors further comprises a threshold memory configured to store the preset upper and lower thresholds.

7. The voltage monitoring apparatus for a plural battery according to claim 1, wherein each of the voltage abnormality detectors further comprises a determination result register configured to store a determination result of the comparator.

8. The voltage monitoring apparatus for a plural battery according to claim 1, wherein each of the voltage abnormality detectors further comprises a digital to analog (DA) converter configured to convert a determination result of the comparator into the analog determination signal.

9. The voltage monitoring apparatus for a plural battery according to claim 1, wherein adjacent ones of the voltage abnormality detectors are connected to each other through a first data line and a second data line and to the monitoring unit through the first data line and the second data line and an insulating interface.

10. The voltage monitoring apparatus for a plural battery according to claim 9, wherein the analog determination signal is transmitted on the first data line and the digital determination signal is transmitted on the second data line.

11. The voltage monitoring apparatus of claim 9, wherein a digital voltage detection instructing signal is sent on a third data line from the monitoring unit to the adjacent ones of the voltage abnormality detectors through the insulating interface.

12. A method in a plural battery outputting a required voltage of a plurality of cells connected in series, the method for monitoring an abnormality in an output voltage of each of the plurality of cells, the method comprising:

digitizing a cell voltage associated with each of the plurality of cells;

comparing the digitized cell voltage associated with each of the plurality of cells with an upper and lower threshold to determine whether the each of the plurality of cells is in an overcharge condition or an overdischarge condition and to produce a determination result, converting the determination result into an analog fail signal; and transmitting the determination result of the comparator by way of both a digital fail signal and the analog fail signal;

determining whether or not each of the plurality of cells are operating normally based on both the transmitted digital fail signal and analog fail signal by: confirming whether information about overcharge and overdischarge of the cells derived from the digital fail signal agrees or disagrees with information about overcharge and overdischarge of the cells derived from the analog fail signal; and based on the confirmation, determining whether or not a communication error is occurring.

* * * * *